(12) United States Patent
Manabe

(10) Patent No.: US 9,111,783 B2
(45) Date of Patent: Aug. 18, 2015

(54) SEMICONDUCTOR DEVICES WITH SELF-ALIGNED SOURCE DRAIN CONTACTS AND METHODS FOR MAKING THE SAME

(71) Applicant: Renesas Electronics Corporation, Kanagawa (JP)

(72) Inventor: Kenzo Manabe, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 13/860,103

(22) Filed: Apr. 10, 2013

(65) Prior Publication Data

US 2013/0270648 A1 Oct. 17, 2013

Related U.S. Application Data

(60) Provisional application No. 61/624,033, filed on Apr. 13, 2012.

(51) Int. Cl.
| | |
|---|---|
| *H01L 21/8238* | (2006.01) |
| *H01L 21/8234* | (2006.01) |
| *H01L 29/423* | (2006.01) |
| *H01L 27/092* | (2006.01) |
| *H01L 21/28* | (2006.01) |
| *H01L 27/088* | (2006.01) |

(52) U.S. Cl.
CPC ........ *H01L 27/092* (2013.01); *H01L 21/28264* (2013.01); *H01L 21/823412* (2013.01); *H01L 21/823425* (2013.01); *H01L 21/823437* (2013.01); *H01L 21/823475* (2013.01); *H01L 21/823807* (2013.01); *H01L 21/823814* (2013.01); *H01L 21/823828* (2013.01); *H01L 21/823871* (2013.01); *H01L 27/088* (2013.01); *H01L 29/4236* (2013.01)

(58) Field of Classification Search
CPC ............... H01L 21/823412; H01L 21/823828; H01L 21/823437; H01L 21/823807; H01L 29/4236
USPC ........... 438/308, 299, 230; 257/364, 412, 413
See application file for complete search history.

(56) References Cited

U.S. PATENT DOCUMENTS

| | | | | |
|---|---|---|---|---|
| 2007/0238320 | A1* | 10/2007 | Bhattacharyya et al. | 438/786 |
| 2008/0054330 | A1* | 3/2008 | Forbes et al. | 257/310 |
| 2008/0308877 | A1* | 12/2008 | Kinoshita et al. | 257/369 |
| 2009/0011562 | A1* | 1/2009 | Licitra et al. | 438/283 |
| 2011/0062501 | A1* | 3/2011 | Soss et al. | 257/288 |
| 2011/0108930 | A1* | 5/2011 | Cheng et al. | 257/412 |
| 2013/0260548 | A1* | 10/2013 | Park | 438/592 |

* cited by examiner

*Primary Examiner* — Kevin Parendo
(74) *Attorney, Agent, or Firm* — Young & Thompson

(57) ABSTRACT

Replacement metal gates well suited for self-aligned contact formation are made by replacing the dummy gate with a recessed polysilicon layer and then effecting an aluminum-polysilicon substitution. The resulting upper polysilicon layer is easily removed from the recessed aluminum layer, which can then be protected with a protective dielectric layer for subsequent formation of a source or drain contact hole.

12 Claims, 5 Drawing Sheets

SEMICONDUCTOR DEVICES WITH SELF-ALIGNED SOURCE DRAIN CONTACTS AND METHODS FOR MAKING THE SAME

BACKGROUND

The invention relates to semiconductor devices with self-aligned source or drain contacts and methods for making the same.

As the scale of transistors continues to decrease, it has become increasingly difficult to form a source or drain contact hole that exposes only the intended source or drain region, and does not also expose part of the gate electrode. If the source or drain contact reaches not only the source or drain but also the gate electrode, an electrical short is created and the transistor does not function.

A protective dielectric film such as SiN is therefore formed on the gate electrode and as gate sidewalls prior to contact hole formation, which protects the gate electrode during contact hole formation by reactive ion etching (RIE), since the RIE process is selective to the silicon dioxide interlayer dielectric in which the contact hole is to be formed, but selective against the SiN protective layer.

However, the conventional techniques and structures for protecting the gate electrode during contact hole formation, especially in the case of forming self-aligned source and drain contacts in replacement metal gate (RMG) transistors, are attended by several difficulties. Selective formation of a dielectric cap has been found to provide insufficient selectivity with respect to the region to be protected. Another proposal has been to oxidize and passivate the upper surface of the metal gate film; however, in that technique it is difficult to control the extent of oxidation of the metal, which can result in a resistivity increase at the gate electrode and increased variation in threshold voltage of the transistor. Yet another proposal has been to recess the metal electrode and cover it with a dielectric cap; however, conventional techniques for recessing a metal gate electrode involve RIE, which is difficult to perform in terms of processing time and selectivity.

SUMMARY

The present inventors have discovered that replacement metal gates well suited for self-aligned contact formation are made by replacing the dummy gate with a recessed polysilicon layer and then effecting an aluminum-polysilicon substitution. The resulting upper polysilicon layer is more easily removed from the recessed aluminum layer, which can then be protected with a protective dielectric layer for subsequent formation of a source or drain contact hole.

Thus, the present invention in one aspect relates to a semiconductor device comprising a semiconductor substrate and a transistor formed on the semiconductor substrate, the transistor comprising a gate electrode and a gate dielectric film located between the gate electrode and the semiconductor substrate. The gate electrode comprises a metal substituted layer and a barrier conductive layer, the barrier conductive layer being located between the gate dielectric film and the metal substituted layer. Gate sidewalls are formed of a dielectric material and extend along the gate electrode on a source and drain side thereof. A protective dielectric layer overlies the gate electrode, and a contact extends to a source or drain region of the transistor, the contact filling a contact hole that partially overlaps the gate electrode. The barrier conductive layer is recessed relative to the sidewalls such that the barrier conductive layer covers lower surfaces of the sidewalls while exposing upper surfaces of the sidewalls.

In preferred embodiments of the semiconductor device according to the present invention, the protective dielectric layer comprises silicon nitride.

In preferred embodiments of the semiconductor device according to the present invention, the protective dielectric layer provides stress for a channel region of the transistor.

In preferred embodiments of the semiconductor device according to the present invention, the barrier conductive layer contains nitrogen.

In preferred embodiments of the semiconductor device according to the present invention, the transistor is an N-channel transistor and the device further comprises another transistor that is a P-channel transistor, the P-channel transistor also being formed on the semiconductor substrate, and wherein the barrier conductive layer for the N-channel transistor has a thickness that is different from a thickness of the barrier conductive layer for the P-channel transistor.

In preferred embodiments of the semiconductor device according to the present invention, the metal substituted layer has a silicon concentration in a range from 0.1 to 10 atomic %.

In preferred embodiments of the semiconductor device according to the present invention, the metal substituted layer comprises at least one of Al, Cu, Ag, Pt and W.

In preferred embodiments of the semiconductor device according to the present invention, the transistor has a gate length of 20 nm or less.

In preferred embodiments of the semiconductor device according to the present invention, the transistor has a gate length of 10-20 nm.

In preferred embodiments of the semiconductor device according to the present invention, the transistor has a gate height of 60 nm or less.

In preferred embodiments of the semiconductor device according to the present invention, the transistor has a gate height of 40-60 nm.

In preferred embodiments of the semiconductor device according to the present invention, the gate electrode is recessed relative to the sidewalls such that the gate electrode covers lower surfaces of the sidewalls while exposing upper surfaces of the sidewalls.

In another aspect, the present invention relates to a method of making a semiconductor device, comprising forming a dielectric layer over a dummy gate electrode overlying a semiconductor substrate, and over side walls adjacent to the dummy gate electrode and source and drain regions adjacent the sidewalls. An upper surface of the dummy gate electrode is exposed and the dummy gate electrode is removed, thereby forming a trench between the sidewalls. Next, a gate dielectric layer, a barrier conductive layer and a silicon layer are formed in the trench. The silicon layer is etched such that an upper surface of the silicon layer is recessed from upper surfaces of the sidewalls, and a metal is deposited on the silicon layer and between the sidewalls, the metal one that is capable of undergoing a substitution reaction with polysilicon. The metal is annealed so as to effect a substitution of the metal for the silicon layer, followed by removal of the silicon layer that is formed overlying the metal following the substitution reaction. A protective dielectric layer is formed overlying the metal and between the sidewalls, the protective dielectric layer protecting the metal during contact hole formation.

In preferred embodiments of the method according to the present invention, the protective dielectric layer comprises silicon nitride.

In preferred embodiments of the method according to the present invention, the barrier conductive layer is a nitrogen-containing film.

In preferred embodiments of the method according to the present invention, an N-channel transistor and a P-channel transistor are formed in a same semiconductor substrate, and a thickness of the barrier conductive layer for the N-channel transistor is different from a thickness of the barrier conductive layer for the P-channel transistor.

In preferred embodiments of the method according to the present invention, the annealing is conducted at a temperature of 400° C. to 500° C.

In preferred embodiments of the method according to the present invention, after the annealing step the metal has a silicon content of 0.1 to 10 atomic %.

In preferred embodiments of the method according to the present invention, the metal is at least one of Al, Cu, Ag, Pt and W.

In preferred embodiments of the method according to the present invention, the sidewalls are spaced from one another by a length of 20 nm or less.

In preferred embodiments of the method according to the present invention, the sidewalls are spaced from one another by a length of 10-20 nm.

In preferred embodiments of the method according to the present invention, the trench has a depth of 60 nm or less.

In preferred embodiments of the method according to the present invention, the trench has a depth of 40-60 nm or less.

BRIEF DESCRIPTION OF THE DRAWINGS

The invention will be more fully understood from the following detailed description of various non-limiting examples thereof, taken with reference to the accompanying drawings, in which.

DETAILED DESCRIPTION

Figure 1:
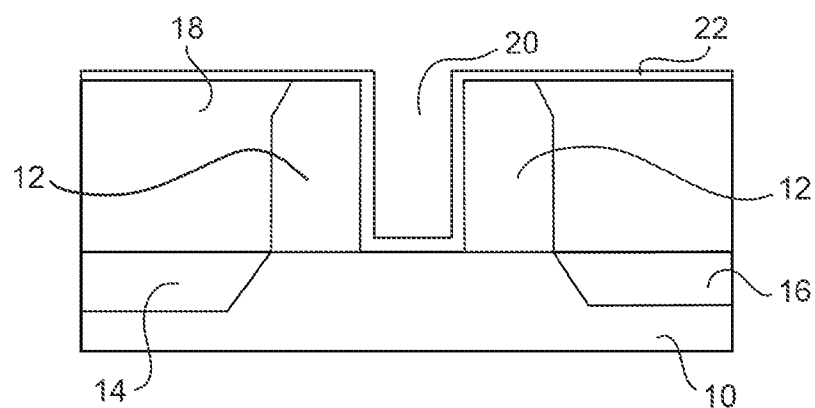
FIG. 1 shows a first stage of processing of a semiconductor device according to an embodiment of the present invention, as well as of a method according to an embodiment of the present invention.

In FIG. 1, certain conventional aspects of replacement metal gate (RMG) transistor formation have already been performed. In particular, a dummy gate dielectric and a dummy gate electrode were formed over semiconductor substrate 10, but as these layers have already been removed they are not shown in FIG. 1. A pair of side wall spacers 12 was then formed on the substrate 10, at the both sides of the dummy gate electrode.

Sidewall spacers 12 may be formed of materials known for that purpose, for example, silicon nitride. Source 14 and drain 16 regions were then formed in substrate 10 by diffusion. Although in this embodiment the source and drain regions 14, 16 are recessed within substrate 10 they may in other embodiments of the invention be elevated in relation to substrate 10.

Dielectric layer 18, for example of silicon dioxide, was then formed over the dummy gate electrode, side walls 12, and source and drain regions 14, 16. An upper surface of the dummy gate electrode was then exposed through dielectric layer 18, and the dummy gate electrode and dummy gate dielectric layer were removed so as to form trench 20 between side walls 12. As is known to those skilled in this art, trench 20 is typically elongated in the direction perpendicular to the plane of the page in FIG. 1, and the gate that will be formed in that trench may serve plural transistors arrayed along the trench.

As shown in FIG. 1, a gate dielectric layer 22 is then formed, which covers the trench 20, which is to say the inner surfaces of side walls 12 and the surface of substrate 10 exposed between the side walls 12. Gate dielectric layer 22 as formed also covers the dielectric film 18. Gate dielectric layer 22 is preferably a high-k (HK) material that is suitable for current and future generation device dimensions. Examples of suitable high-k gate dielectrics are hafnium-based gate dielectrics, including hafnium silicate materials and dielectrics composed of layers of materials having different chemical compositions. Gate dielectric layer 22 is preferably deposited by atomic layer deposition (ALD) to a thickness in the range of 0.1 to 10 nm.

Figure 2:
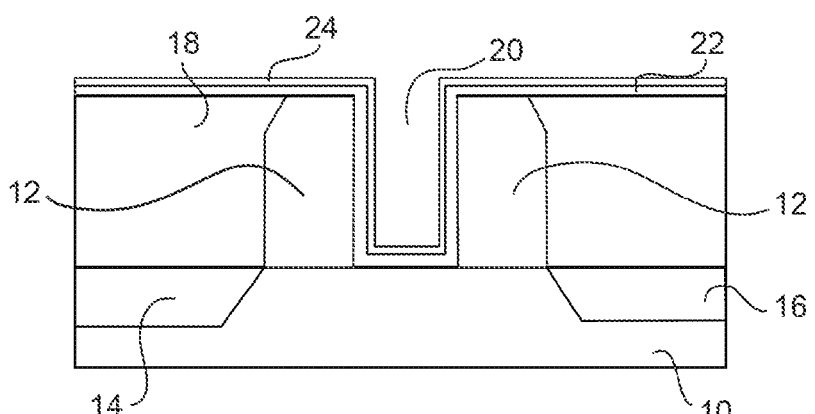
FIG. 2 shows a subsequent stage of processing of a semiconductor device according to an embodiment of the present invention, as well as of a method according to an embodiment of the present invention.

Next, as shown in FIG. 2, a barrier conductive layer 24 is formed on the gate dielectric layer 22. Barrier conductive layer 24 is preferably a work function metal such as titanium nitride (TiN). Barrier conductive layer 24 acts as a stopper during the metal-silicon substitution reaction that will be described hereinafter. Barrier conductive layer also permits adjusting the threshold voltage of the transistor. For example, when N-channel and P-channel transistors are both formed on substrate 10, then it is preferred that barrier conductive layer 24 have a different thickness in the N-channel transistors than it does in the P-channel transistors, in particular a greater thickness for the PMOS devices than for the NMOS devices.

This permits the different threshold voltages that are necessary for PMOS and NMOS devices to be achieved solely by varying the thickness of the barrier conductive layer.

Barrier conductive layer 24 may be formed for example by chemical vapor deposition (CVD) or by atomic layer deposition (ALD), and is preferably formed to a thickness in the range from 0.1 to 10 nm.

Figure 3:
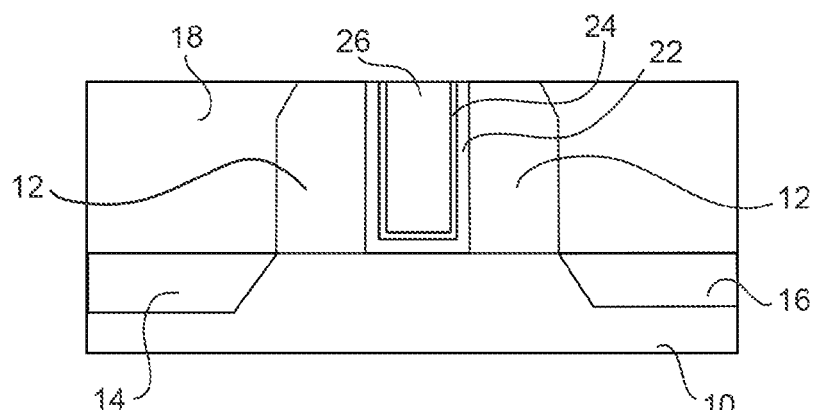
FIG. 3 shows a subsequent stage of processing of a semiconductor device according to an embodiment of the present invention, as well as of a method according to an embodiment of the present invention.

Next, as shown in FIG. 3, trench 20 is filled with polysilicon 26, for example deposited by CVD, and excess polysilicon 26 along with layers 22 and 24 are removed from dielectric layer 18 and from the upper surfaces of sidewalls 12, for example by chemical mechanical polishing (CMP). Thus, polysilicon layer and layers 22 and 24 remain only within the trench 20 that has now been filled by those layers.

Figure 4:
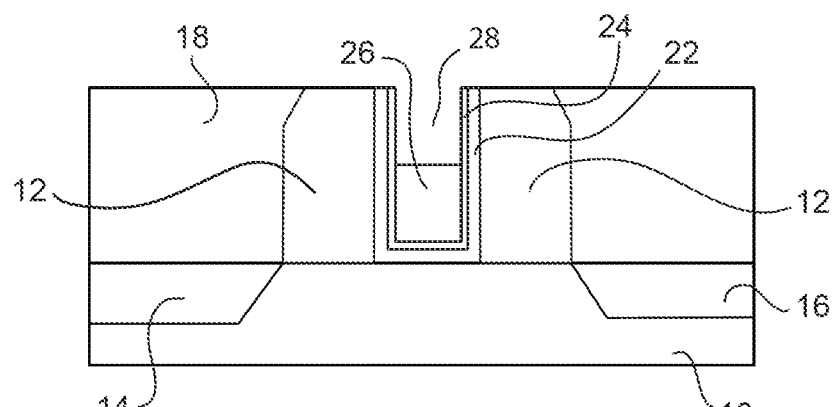
FIG. 4 shows a subsequent stage of processing of a semiconductor device according to an embodiment of the present invention, as well as of a method according to an embodiment of the present invention.

Then, as shown in FIG. 4, the upper part of polysilicon layer 26 is removed, such that the remaining polysilicon is recessed relative to sidewalls 12 and layers 22 and 24 that remain covering the inner surfaces of those sidewalls. A shallower trench 28 is thereby created, defined between sidewalls 12 and from below by polysilicon layer 26.

This partial removal of polysilicon 26 is preferably performed by reactive ion etching (RIE). As those skilled the art are aware, polysilicon is relatively easy to remove by RIE, in contrast to, for example, aluminum, and this is a significant benefit of the devices and methods according to preferred embodiments of the present invention.

Figure 5:
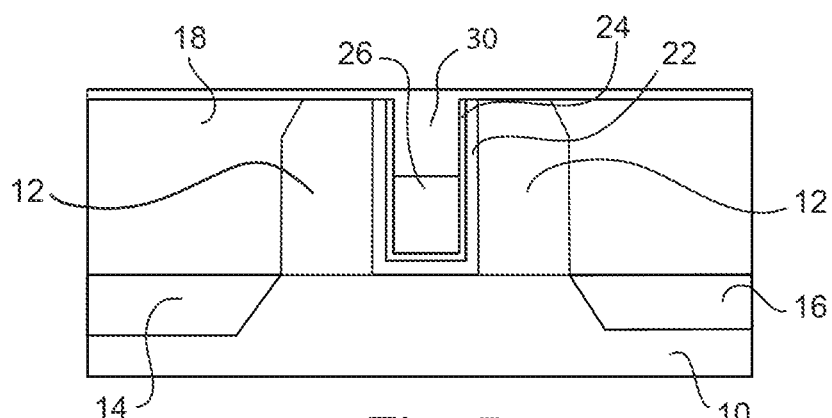
FIG. 5 shows a subsequent stage of processing of a semiconductor device according to an embodiment of the present invention, as well as of a method according to an embodiment of the present invention.

Next, as shown in FIG. 5, a layer of metal 30 is deposited for example by sputtering or CVD so as to fill the trench 30. Excess metal 30 will in practice typically also cover dielectric layer 18 and the top of sidewalls 12, in which case the excess metal 30 is removed for example by CMP, such that the metal 30 remains only between the sidewalls 12, as shown in FIG. 6.

Metal 30 is a metal that is capable of undergoing a substitution reaction with silicon, especially polysilicon, under the influence of heat. Examples of such materials include aluminum, copper, silver, platinum and tungsten. Mixtures of such metals may also be used. Aluminum is most preferred among such metals at present.

Figure 6:
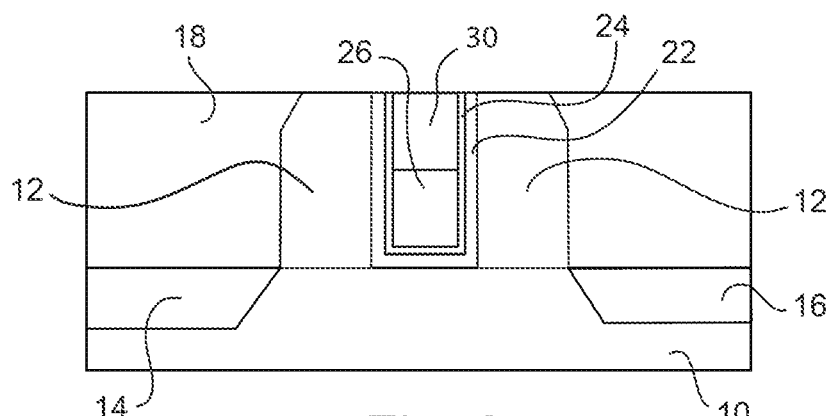
FIG. 6 shows a subsequent stage of processing of a semiconductor device according to an embodiment of the present invention, as well as of a method according to an embodiment of the present invention.
Figure 7:
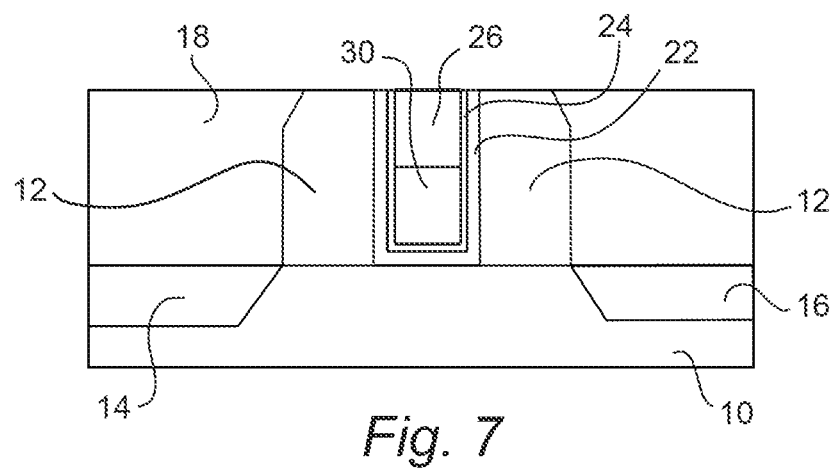
FIG. 7 shows a subsequent stage of processing of a semiconductor device according to an embodiment of the present invention, as well as of a method according to an embodiment of the present invention.

The structure depicted in FIG. 6 is then subjected to annealing at a temperature in the range of 400° C. to 500° C., and more preferably 400° C. to 450° C. Such annealing causes the aluminum 30 and polysilicon 26 to undergo a substitution reaction as is described for example by Fukuda et. al., "A New Aluminum Pattern Formation Using Substitution Reaction of Aluminum for Polysilicon and Its Application to MOS Device Fabrication," *IEEE Trans. Electr. Dev.*, vol. ED-31, no. 6, pp. 828-832 (June 1984).

The replacement of polysilicon by aluminum and vice-versa will be nearly complete in such a substitution reaction; however, a small residual quantity of silicon will remain in the now underlying aluminum layer, and may serve as a forensic indicator of the substitution reaction having been performed. In particular, the metal layer 30 after it is relocated by the substitution reaction preferably has a silicon concentration in a range from 0.1 to 10 atomic %.

Figure 8:
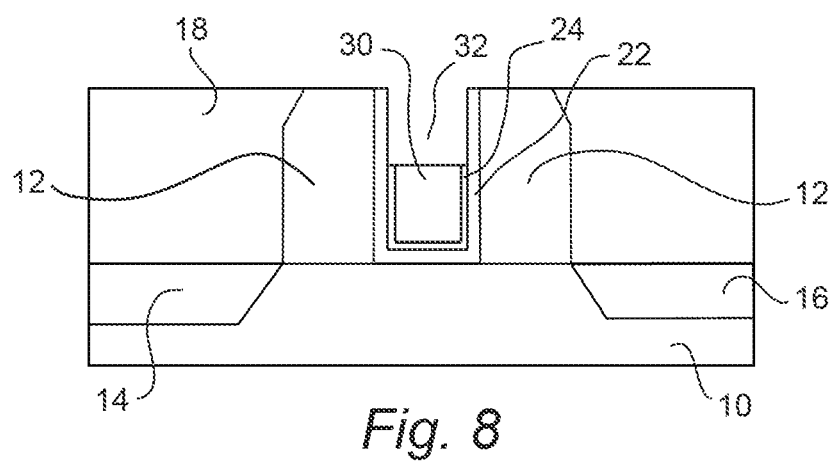
FIG. 8 shows a subsequent stage of processing of a semiconductor device according to an embodiment of the present invention, as well as of a method according to an embodiment of the present invention.

As shown in FIG. 8, the relocated polysilicon layer 26 is then removed from above the metal layer 30, to create a new trench 32. Polysilicon layer 26 is preferably removed by RIP, which again is a significant benefit in relation to conventional techniques in view of the comparative ease with which polysilicon can be removed by RIE. It will be noted that the RIE serves also to remove the portions of barrier conductive layer 24 that had been above the metal layer 30, such that the barrier conductive layer 24 is now recessed relative to sidewalls 12 to approximately the same extent as is metal layer 30. High-k layer 22 on the other hand is less susceptible to RIE and therefore remains covering all or substantially all of the inner surfaces of sidewalls 12.

Figure 9:
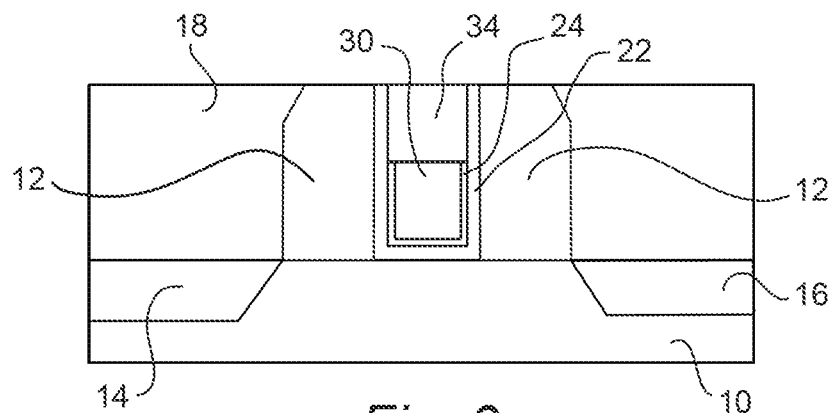
FIG. 9 shows a subsequent stage of processing of a semiconductor device according to an embodiment of the present invention, as well as of a method according to an embodiment of the present invention.

Turning now to FIG. 9, the newly-formed trench 32 is next filled with a protective dielectric layer 34, which in this embodiment is silicon nitride (SiN), the same material utilized for side walls 12. In FIG. 9 the protective dielectric layer 34 is shown only between the sidewalls 12, indicating that excess dielectric material deposited on the layer 18 and sidewall 12 upper surfaces has been removed by CMP.

Figure 10:
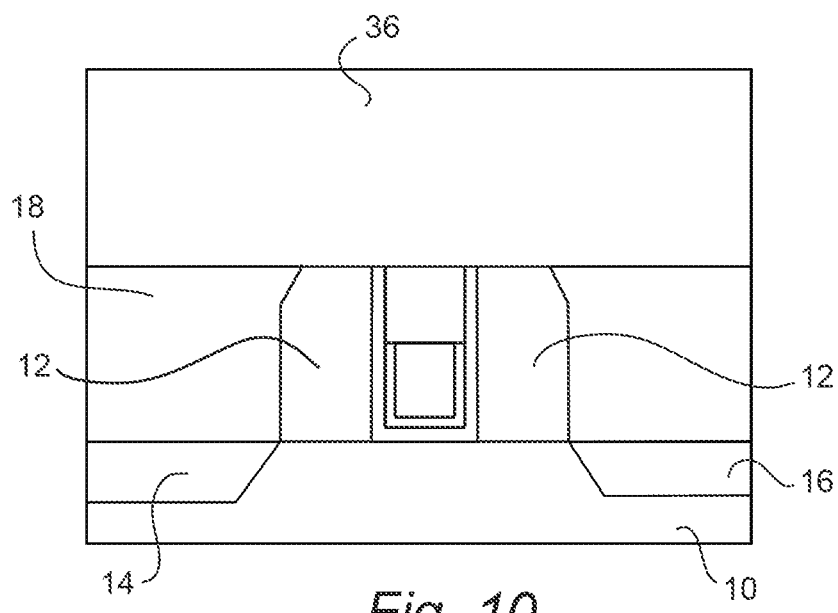
FIG. 10 shows a subsequent stage of processing of a semiconductor device according to an embodiment of the present invention, as well as of a method according to an embodiment of the present invention.
Figure 11:
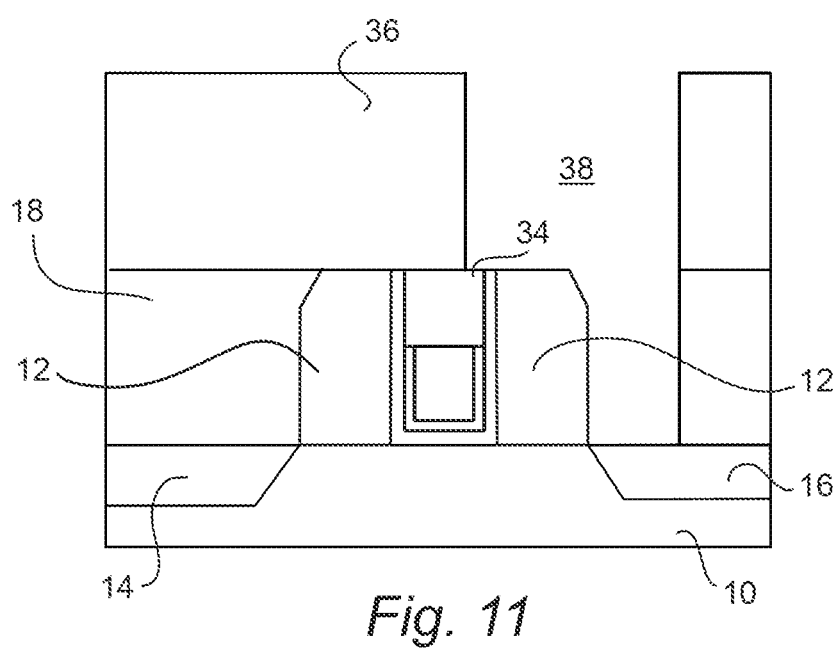
FIG. 11 shows a subsequent stage of processing of a semiconductor device according to an embodiment of the present invention, as well as of a method according to an embodiment of the present invention.

Next, as shown in FIG. 10, an interlayer dielectric layer 36 is formed, which may be for example silicon dioxide. Then, as shown in FIG. 11, a contact hole 38 is formed by RIE of layers 36 and 18, so as to expose the drain region 16. Although contact hole 38 in this embodiment partially overlaps the gate electrode, the contact hole 38 nevertheless does not expose the metal layer 30, thanks to the protective layer 34 that is not attacked by RIE.

Figure 12:
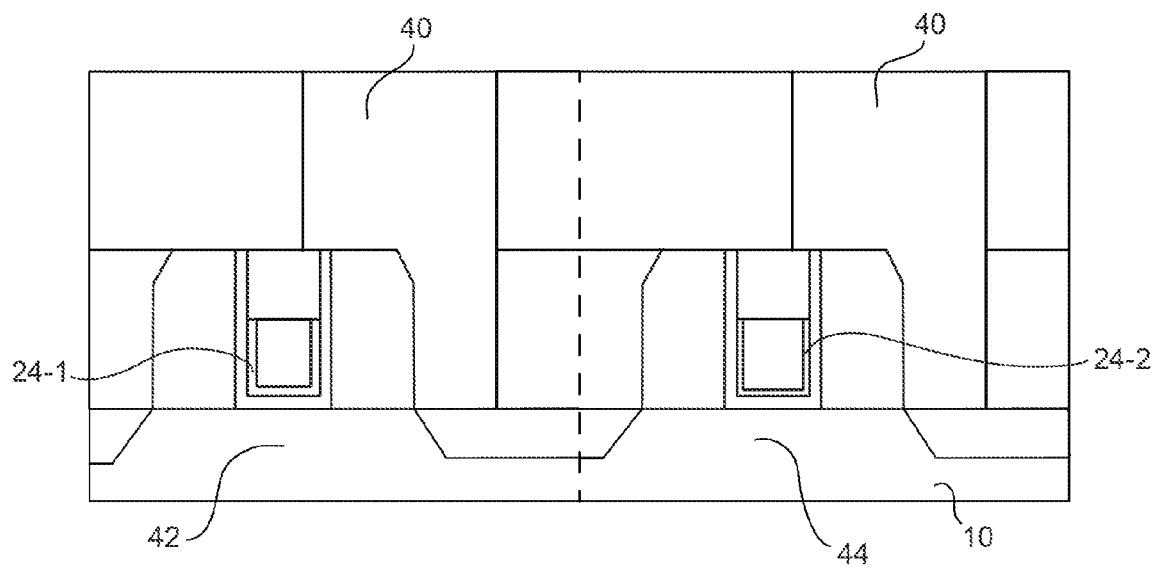
FIG. 12 shows a device according to an embodiment of the present invention.

Lastly, as shown in FIG. 12, contact hole 38 is filled with a conductive material to form a drain contact 40. In this embodiment, contact 40 is copper and is formed by a damascene technique in which the larger pattern of interconnects is formed using trenches and vias. Contact 40 is preferably although not necessarily a material that is different from that of the metal layer 30. In this embodiment, metal layer 30 is aluminum and contact 40 is copper. Contact 40 could alternatively be formed, for example, of tungsten.

FIG. 12 also illustrates that the devices and methods of the present invention provide an advantage to the formation of N-channel and P-channel transistors on a common semiconductor substrate 10. In FIG. 12, the substrate 10 is suitably doped so as to have a P-channel region 42 and an N-channel region 44, such that the left-side transistor in FIG. 12 is a PMOS transistor and the right side transistor in FIG. 12 is an NMOS transistor. As is known to those skilled in the art, different threshold voltages are necessary for PMOS and NMOS devices. In FIG. 12, barrier conductive layer 24-1 for the PMOS transistor is formed to a greater thickness than barrier conductive layer 24-2 for the NMOS transistor. This permits the different threshold voltages that are necessary for PMOS and NMOS devices to be achieved solely by varying the thickness of the barrier conductive layer.

As discussed above, the embodiments and examples discussed herein are non-limiting, and various constitutions other than those described above can also be adopted.

For example, amorphous silicon may be used instead of polysilicon. Amorphous silicon is advantageous for certain applications as it can be formed at lower temperatures than polysilicon, which can provide better gap fill characteristics and/or prevent possible variations in the threshold voltage of the transistors.

It is furthermore apparent that the present invention may be variously modified without departing from the scope and spirit of the present invention as set forth in the accompanying claims.

What is claimed is:

1. A semiconductor device comprising:
   a semiconductor substrate;
   at least one transistor formed on said semiconductor substrate, said at least one transistor comprising
      a gate electrode, and
      a gate dielectric film located between said gate electrode and said semiconductor substrate,
      the gate electrode comprising
         a metal substituted layer, and a barrier conductive layer, said barrier conductive layer being located between said gate dielectric film and said metal substituted layer;

gate sidewalls formed of a dielectric material and extending along said gate electrode on a source and drain side thereof, the metal substituted layer being recessed with respect to the gate sidewalls;

a protective dielectric layer overlying said gate electrode; and a contact extending to a source or drain region of said transistor, said contact filling a contact hole that partially overlaps said gate electrode;

wherein said barrier conductive layer is recessed relative to said sidewalls such that said barrier conductive layer covers lower side surfaces of said sidewalls while exposing upper side surfaces of said sidewalls, the barrier conductive layer being recessed relative to the sidewalls to approximately a same level as the metal substituted layer is recessed relative to the sidewalls, the protective dielectric layer covers upper side surfaces of the gate dielectric film and top sidewall surfaces of the metal substituted layer such that the metal substituted layer is disposed entirely between the barrier conductive layer and the protective dielectric layer, and the protective dielectric layer covers the entire top surface of the gate electrode.

2. The semiconductor device according to claim 1, wherein said protective dielectric layer comprises silicon nitride.

3. The semiconductor device according to claim 2, wherein said protective dielectric layer provides stress for a channel region of said transistor.

4. The semiconductor device according to claim 1, wherein said barrier conductive layer contains nitrogen.

5. The semiconductor device according to claim 1, wherein said metal substituted layer has a silicon concentration in a range from 0.1 to 10 atomic %.

6. The semiconductor device according to claim 1, wherein said metal substituted layer comprises at least one of Al, Cu, Ag, Pt and W.

7. The semiconductor device according to claim 1, wherein said transistor has a gate length of 20 nm or less.

8. The semiconductor device according to claim 7, wherein the gate length is in a range of 10-20 nm.

9. The semiconductor device according to claim 1, wherein said transistor has a gate height of 60 nm or less.

10. The semiconductor device according to claim 9, wherein the gate height is in a range of 40-60 nm.

11. The semiconductor device according to claim 1, wherein said gate electrode is recessed relative to said sidewalls such that said gate electrode covers lower side surfaces of said sidewalls while exposing upper side surfaces of said sidewalls.

12. A semiconductor device comprising:

a semiconductor substrate;

at least one transistor formed on said semiconductor substrate, said at least one transistor comprising
  a gate electrode, and
  a gate dielectric film located between said gate electrode and said semiconductor substrate,
  the gate electrode comprising
    a metal substituted layer, and
    a barrier conductive layer, said barrier conductive layer being located between said gate dielectric film and said metal substituted layer;

gate sidewalls formed of a dielectric material and extending along said gate electrode on a source and drain side thereof;

a protective dielectric layer overlying said gate electrode; and a contact extending to a source or drain region of said transistor, said contact filling a contact hole that partially overlaps said gate electrode;

wherein said barrier conductive layer is recessed relative to said sidewalls such that said barrier conductive layer covers lower side surfaces of said sidewalls while exposing upper side surfaces of said sidewalls, the protective dielectric layer covers upper side surfaces of the gate dielectric film and top sidewall surfaces of the metal substituted layer such that the metal substituted layer is disposed entirely between the barrier conductive layer and the protective dielectric layer, said at least one transistor includes an N-channel transistor and a P-channel transistor, both the N-channel transistor and the P-channel transistor being formed on said semiconductor substrate and including the barrier conductive layer, and said barrier conductive layer in said N-channel transistor has a thickness that is different from a thickness of said barrier conductive layer in said P-channel transistor.

* * * * *